(12) United States Patent
Madni

(10) Patent No.: US 6,480,066 B1
(45) Date of Patent: Nov. 12, 2002

(54) AMPLIFIERS

(75) Inventor: Arshad Madni, Swindon (GB)

(73) Assignee: Mitel Semiconductor Limited, Swindon (GB)

(*) Notice: Subject to any disclaimer, the term of this patent is extended or adjusted under 35 U.S.C. 154(b) by 0 days.

(21) Appl. No.: 09/705,499

(22) Filed: Nov. 2, 2000

(30) Foreign Application Priority Data

Jan. 22, 2000 (GB) .............................................. 0001539

(51) Int. Cl.⁷ ................................................. H03F 3/45
(52) U.S. Cl. ........................................ 330/254; 327/359
(58) Field of Search ................................. 330/254, 282, 330/260; 327/359

(56) References Cited

U.S. PATENT DOCUMENTS

| | | |
|---|---|---|
| 4,553,108 A | 11/1985 | Young |
| 4,704,738 A * | 11/1987 | Graziadei et al. ........... 330/254 |
| 5,382,919 A | 1/1995 | Lawton |
| 5,389,891 A * | 2/1995 | Philippe ...................... 330/253 |
| 5,552,742 A * | 9/1996 | Perkins ........................ 330/252 |
| 5,668,468 A * | 9/1997 | Cargill ........................ 323/316 |
| 5,834,976 A * | 11/1998 | Tomasini et al. ........... 330/294 |
| 5,955,921 A * | 9/1999 | Ide et al. ..................... 330/254 |
| 6,040,731 A * | 3/2000 | Chen et al. .................. 327/359 |
| 6,049,251 A * | 4/2000 | Meyer ......................... 330/254 |
| 6,147,559 A * | 11/2000 | Fong .......................... 330/294 |
| 6,211,737 B1 * | 4/2001 | Fong .......................... 330/282 |

FOREIGN PATENT DOCUMENTS

EP  0 765 028 A2  9/1996

* cited by examiner

*Primary Examiner*—Robert Pascal
*Assistant Examiner*—Khanh Van Nguyen
(74) *Attorney, Agent, or Firm*—Kirschstein, et al.

(57) ABSTRACT

An AC voltage amplifier arrangement comprising an input stage 1 having an input, an amplifier 3 connected in series shunt feedback mode, and an output, further comprises a variable gain amplification stage 2 having an input coupled to the output of said input stage 1, and an output. The amplifiers 3, 5 of the input and variable gain amplification stages 1, 2 are arranged to operate in current mode.

13 Claims, 3 Drawing Sheets

AMPLIFIERS

FIELD OF THE INVENTION

The present invention relates to amplifiers and more particular to amplifiers employing shunt feedback.

BACKGROUND TO THE INVENTION

The traditional series shunt feedback architecture illustrated in FIG. 1 has been widely hailed as the preferred architecture for Low Noise Amplifiers (LNAs) requiring a well defined input impedance. However combining series shunt feedback with Gilbert's current steering techniques for providing an Automatic Gain Control (AGC) function presents certain difficulties.

The following equations describe how the input impedance Rin of the traditional series shunt feedback amplifier is set by a negative feedback amplifier:

$$Rf = Rs*(1+A)$$

$$Rin = Rf/(1+A)$$

where Rf is the effective feedback impedance, Rs is the source impedance, and |A| is the magnitude of the gain of the amplifier. It will be appreciated that as long as Rf remains constant, then so does the input impedance Rin. However, if the amplifier has a varying gain, then the input impedance Rin will also change.

A potential solution to this problem is offered by the architecture of FIG. 2, where the input impedance of an amplifier arrangement is set by an input stage comprising an amplifier which has a fixed gain. The output of the input stage feeds a variable gain amplifier stage. This solution is not optimal however, since the input stage has a fixed gain and the input signal to the variable gain amplifier stage is therefore higher than the input signal to the amplifier arrangement as a whole. This creates a problem in signal handling requirements and may result in a power in-efficient solution.

In view of the disadvantages noted above, existing amplifier arrangements may not meet the strict requirements of modem electronic systems, such as interactive cable television equipment, in which a range of high performance RF products are required ranging from mixer oscillator circuits to LNAs with AGC and loop through circuits.

SUMMARY OF THE INVENTION

It is an object of the present invention to provide an amplifier arrangement having a stable input impedance. It is a further object of the present invention to provide a low noise amplifier which is power efficient. These and other objects are achieved at least in part by an amplifier arrangement in which the amplifier stages thereof are operated in current mode.

According to a first aspect of the present invention there is provided an AC voltage amplifier arrangement comprising:

an input stage having an input, an amplifier connected in series shunt feedback mode, and an output; and
a second stage having an input coupled to the output of said input stage, and an output, wherein said input and second stages are arranged to operate in current mode.

Preferably, said second stage is a variable gain amplification stage.

Preferably, the voltage amplifier arrangement is arranged to amplify radio frequency voltage signals.

Preferably, said amplifier of the input stage is a transconductance amplifier. More preferably, the transconductance amplifier comprises a bipolar junction transistor configured as a common emitter stage, or a differential pair of bipolar junction transistors configured as common emitter stages.

Preferably, the arrangement comprises a unity gain buffer amplifier coupled in the series shunt feedback loop of the input stage.

Preferably, said second stage comprises a current steering arrangement arranged in use to steer a proportion of the current, provided to the input of the second stage, to an output load, whereby an output voltage is developed across said load and is available at said output of the second stage. The current steering arrangement may be a Gilbert steering stage. More preferably, said current steering arrangement comprises a pair of bipolar junction transistors having their emitters coupled together and to said output of the input stage. The current steering arrangement may comprise two pairs of bipolar junction transistors in a differential arrangement, coupled respectively to differential outputs of the input stage.

The second stage may be arranged to be controlled by an Automatic Gain Control (AGC) signal in order to maintain the output of the stage at a desired level. More preferably, where the stage comprises a pair (or pairs) of bipolar junction transistors, said AGC signal is applied to the bases of the transistors.

The second stage may comprise a mixer or a buffer.

According to a second aspect of the present invention there is provided a method of amplifying an AC voltage signal, the method comprising:

converting the voltage signal into a current signal;
amplifying said current signal to a desired level; and
converting the amplified current signal into an amplified voltage signal.

Preferably, the amplification factor by which the current signal is amplified is less than one.

Preferably, amplification of the current signal comprises splitting the current signal into at least two parts, with one of said parts being converted into the amplified voltage signal.

DETAILED DESCRIPTION OF CERTAIN EMBODIMENTS

Figure 1:
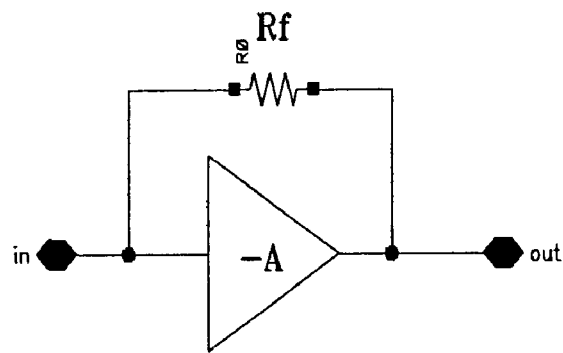
FIG. 1 illustrates schematically a traditional series shunt feedback voltage amplifier.
Figure 2:
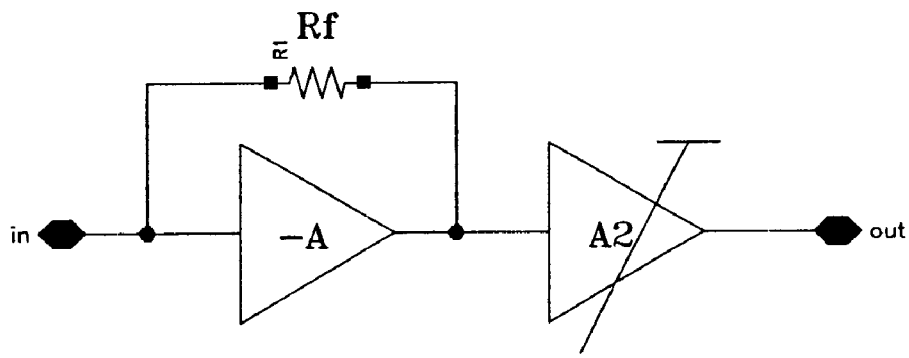
FIG. 2 illustrates schematically-a voltage amplifier having a fixed gain input stage and a variable gain output stage.
Figure 3:
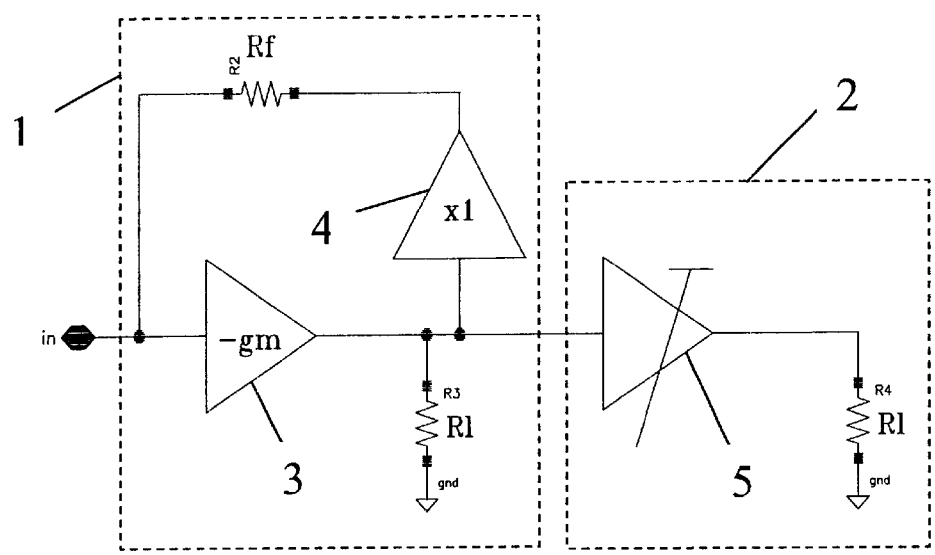
FIG. 3 illustrates schematically a voltage amplifier according to an embodiment of the present invention.

Known voltage amplifier arrangements have been described above with reference to FIGS. 1 and 2. FIG. 3 illustrates an improved voltage amplifier arrangement which is suitable for use in low noise RF applications and which offers Automatic Gain Control (AGC) and low power consumption.

The arrangement of FIG. 3 comprises an input stage 1 and a variable gain stage 2. The input stage comprises a transconductance amplifier 3 having a transconductance of −gm. The transconductance amplifier 3 drives a load R1, and thus the voltage gain of the input stage 1 is −gmR1. The output of the transconducance amplifier 3 is applied to the input of a unity gain buffer amplifier 4 connected in a feedback loop. The output of the buffer amplifier 4 drives a feedback resistance Rf as well as the input to an AGC amplifier 5 of the variable gain stage 2. As the input impedance of the variable gain stage 2 is very low (see below), the voltage gain provided by the input stage 1 is given by:

$$Gain = -gm*Rl*\lambda$$

where gm is the transconductance of the amplifier 3, and is the agc gain (variable between 0 and 1).

Figure 4:
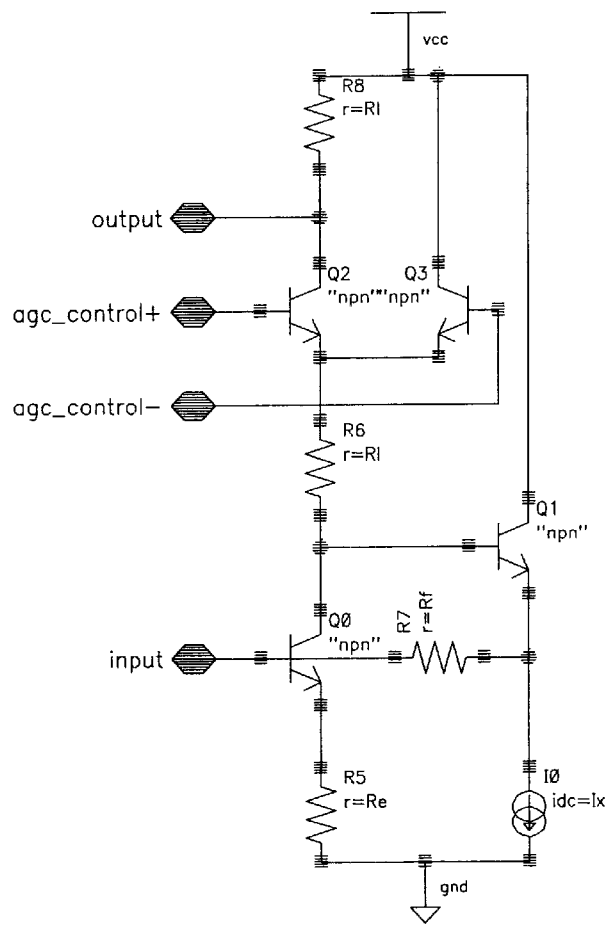
FIG. 4 illustrates a detailed circuit diagram implementing the amplifier of FIG. 3.

FIG. 4 illustrates a detailed circuit implementing the amplifier arrangement of FIG. 3. Transistor Q0 is configured as a common emitter stage and has a transconductance:

$$gm = -vin/(Re+re).$$

The collector current of Q0 is converted into a voltage across the resistance R1, the voltage being given by:

$$Vout - vin*Rl(Re+re)$$

where the voltage gain is:

$$-Rl/(Re+re).$$

The voltage Vout developed across the resistance R1 is buffered via the emitter follower transistor Q1 and is fed back via resistance Rf to determine the input impedance Rin. The input impedance Rin is given by;

$$Rin = Rf/(1+(Re+re)).$$

The resistor R1 connected to the collector of Q0 is also connected to the emitters of transistors Q2 and Q3. Transistors Q2 and Q3 receive at their bases +ve and −ve AGC signals respectively. Under maximum AGC, transistor Q3 is effectively off. As resistance Rl connects the collector of Q0 and the emitter of Q2, Q2 operates effectively in a common base mode, and thus for large values of resistance R1 the signal current from the collector of transistor Q2 can be approximated as:

$$Isq2 = vin/(Re+re).$$

It will be appreciated that this current is the same as the signal current emerging from the collector of transistor Q0. By varying the AGC signal applied to the bases of transistors Q2 and Q3, some of the signal current will be steered into vcc as Q3 turns on more strongly, thus reducing the voltage gain of the amplifier arrangement. It will be further appreciated that, with the negative voltage shunt feedback provided by the input stage, the input impedance of the arrangement is also set. Therefore, the combination of the shunt feedback and common base loaded output results in a low noise amplifier with AGC, without burning any unnecessary power.

Figure 5:
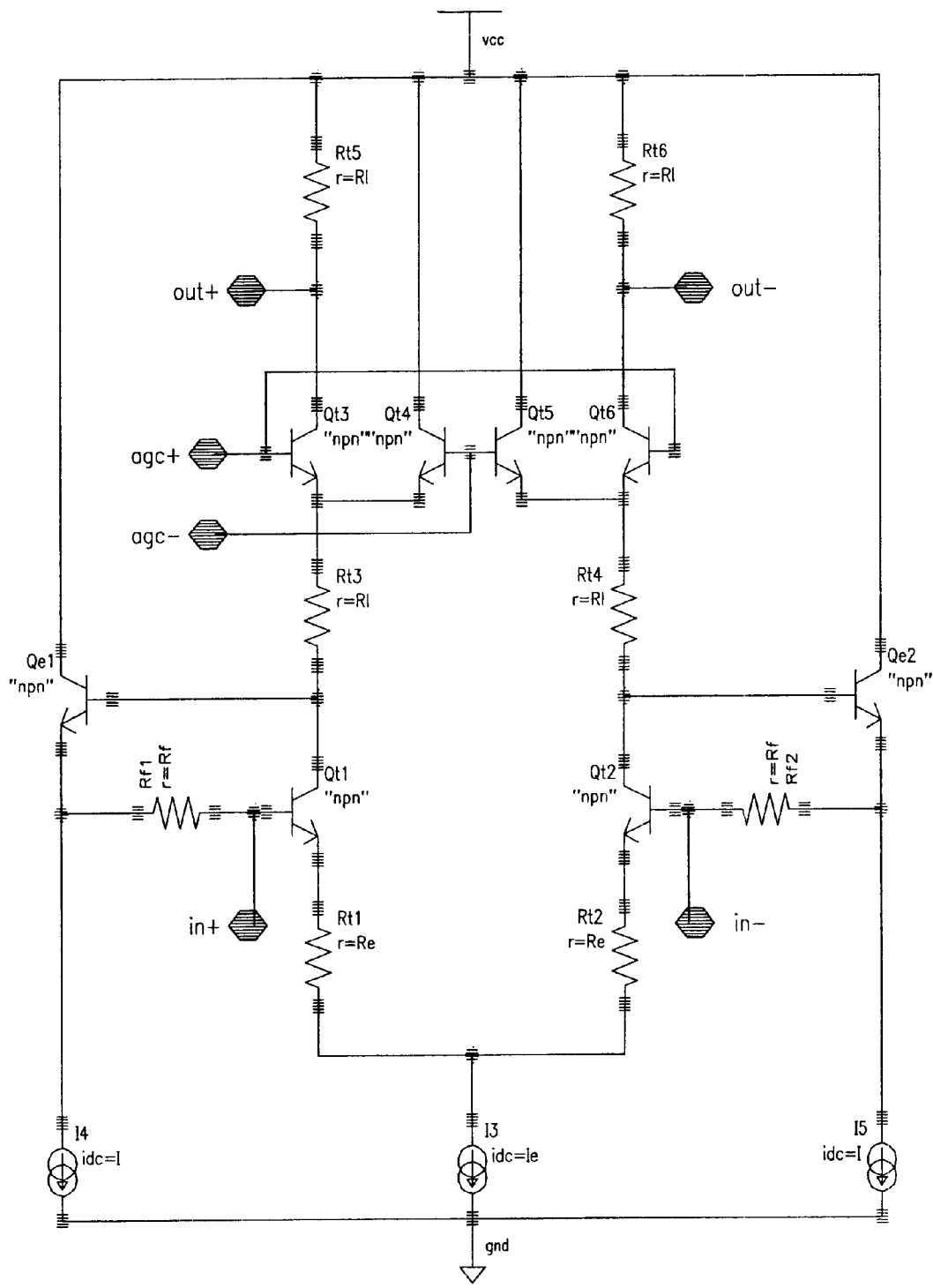
FIG. 5 illustrates a detailed circuit diagram implementing a differential configuration of the amplifier of FIG. 3.

The amplifier arrangement illustrated in FIG. 4 can be extended to a full differential version as shown in FIG. 5. Transistors Qt1 and Qt2, resistances Rt1 and Rt2, and the current source 13 together form the main long tail pair transconductance amplifier. The inputs are fed via the in+ and in− input ports. The output of the long tail pair amplifier feeds into load resistances Rt3 and Rt4 which convert the current output into a voltage output. The voltage output is in turn fed back through transistors Qe1 and Qe2, and resistances Rf1 and Rf2 respectively, in a negative feedback fashion. This arrangement provides a long tail pair LNA with a controlled input impedance. The output of the LNA is obtained by connecting the load resistors Rt3 and Rt4 to the emitters of the current steering pairs Qt3, Qt4, and Qt5, Qt6 respectively. Hence the output of the LNA is now converted back into a current which can then be steered either fully into the final load resistors Rt5 and Rt6 or conversely into vcc, by appropriate adjustment of the agc+ and agc− inputs It will be appreciated by the person of skill in the art that various modifications may be made to the above described embodiments without departing from the scope of the present invention. For example, the circuits illustrated in FIGS. 4 and 5 utilize bipolar junction transistors, and in particular npn bipolar junction transistors. However, the invention may be implemented using pnp bipolar junction transistors or a combination of npn and pnp bipolar junction transistors, or using alternative transistor structures including, but not limited to, NMOS, FETs, and GaAs MESFETs.

What is claimed is:
1. An AC voltage amplifier arrangement, comprising:
   a) an input stage including a transconductance amplifier having an input and an output;
   b) a shunt feedback path connected between said input and said output of said transconductance amplifier and providing a constant feedback factor, said feedback path including a unity gain buffer having an input connected to said output of said transconductance amplifier; and
   c) a current steering second stage cascode-connected to said transconductance amplifier whereby an output current at said output of said transconductance amplifier passes through said second stage.

2. The arrangement according to claim 1, wherein said feedback path includes a fixed resistor.

3. The arrangement according to claim 1, comprising a load resistor connected between said output of said transconductance amplifier and said second stage.

4. The arrangement according to claim 1, wherein said second stage is a variable gain amplification stage.

5. The arrangement according to claim 1, wherein the voltage amplifier arrangement is arranged to amplify radio frequency voltage signals.

6. The arrangement according to claim 1, wherein said transconductance amplifier comprises a bipolar junction transistor configured as a common emitter stage.

7. The arrangement according to claim 1, wherein said transconductance amplifier comprises a differential pair of bipolar junction transistors configured as common emitter stages.

8. The arrangement according to claim 1, wherein said current steering second stage comprises a pair of bipolar junction transistors having their emitters coupled together and to said output of said transconductance amplifier.

9. The arrangement according to claim 1, wherein said current steering second stage comprises two pairs of bipolar junction transistors in a differential arrangement, coupled respectively to differential outputs of said amplifier arrangement.

10. The arrangement according to claim 1, wherein the second stage is arranged to be controlled by an automatic gain control (AGC) signal in order to maintain an output of the second stage at a desired level.

11. The arrangement according to claim 9, wherein the second stage is arranged to be controlled by an automatic gain control (AGC) signal in order to maintain an output of the second stage at a desired level, and wherein said AGC signal is applied to bases of the transistors of said two pairs of bipolar junction transistors.

12. The arrangement according to claim 1, wherein said second stage comprises a buffer stage.

13. The arrangement according to claim 1, wherein said second stage comprises a mixer stage.

* * * * *